(12) United States Patent
Ochi et al.

(10) Patent No.: US 7,775,446 B2
(45) Date of Patent: Aug. 17, 2010

(54) CARD TYPE INFORMATION DEVICE AND METHOD FOR MANUFACTURING SAME

(75) Inventors: Shozo Ochi, Osaka (JP); Osamu Uchida, Osaka (JP); Shigeaki Sakatani, Osaka (JP); Daisuke Sakurai, Osaka (JP); Masato Mori, Osaka (JP); Hiroshi Sakurai, Osaka (JP); Hidenobu Nishikawa, Nara (JP)

(73) Assignee: Panasonic Corporation, Osaka (JP)

( * ) Notice: Subject to any disclaimer, the term of this patent is extended or adjusted under 35 U.S.C. 154(b) by 259 days.

(21) Appl. No.: 12/160,541

(22) PCT Filed: Feb. 26, 2007

(86) PCT No.: PCT/JP2007/053475

§ 371 (c)(1),
(2), (4) Date: Jul. 10, 2008

(87) PCT Pub. No.: WO2007/105469

PCT Pub. Date: Sep. 20, 2007

(65) Prior Publication Data

US 2009/0173795 A1   Jul. 9, 2009

(30) Foreign Application Priority Data

Mar. 10, 2006   (JP)   ............................... 2006-065360

(51) Int. Cl.
G06K 19/06   (2006.01)
H01Q 1/00   (2006.01)
H01Q 1/36   (2006.01)

(52) U.S. Cl. .......................... 235/492; 343/787; 343/895

(58) Field of Classification Search ................. 343/870, 343/788, 737, 787, 895, 700 MS, 741, 867, 343/702; 257/666, 659; 235/492; 713/310
See application file for complete search history.

(56) References Cited

U.S. PATENT DOCUMENTS

| 6,940,153 | B2 * | 9/2005 | Spencer et al. ............... 257/659 |
| 6,985,363 | B2 * | 1/2006 | Yagi et al. .................... 361/760 |
| 7,451,934 | B2 * | 11/2008 | Takahashi et al. ........... 235/492 |
| 2006/0151614 | A1 | 7/2006 | Nishizawa et al. |
| 2008/0111756 | A1 * | 5/2008 | Ochi et al. ................... 343/788 |
| 2008/0303735 | A1 * | 12/2008 | Fujimoto et al. ............ 343/787 |
| 2009/0040734 | A1 * | 2/2009 | Ochi et al. ................... 361/737 |
| 2009/0051606 | A1 * | 2/2009 | Ochi et al. ................... 343/702 |

FOREIGN PATENT DOCUMENTS

| JP | 4-233786 | 8/1992 |
| JP | 6-344692 | 12/1994 |
| JP | 2001-195553 | 7/2001 |
| JP | 2001-251129 | 9/2001 |
| JP | 2001-351085 | 12/2001 |
| JP | 2001-352208 | 12/2001 |
| JP | 2005-183741 | 7/2005 |
| WO | WO 2005/004047 A1 | 1/2005 |

* cited by examiner

*Primary Examiner*—Michael G Lee
*Assistant Examiner*—Keith Goodman, Jr.
(74) *Attorney, Agent, or Firm*—McDermott Will & Emery LLP

(57) ABSTRACT

Card type information device includes wiring board having a wiring pattern with an electronic component mounted on a first face of wiring board and an antenna connecting electrode, antenna board having antenna pattern with antenna terminal electrode formed on a first face of antenna board, magnetic material placed between wiring board and antenna board confronting each other, flexible wiring board for coupling the antenna connecting electrode to antenna terminal electrode, and housing for accommodating wiring board, antenna board, magnetic material, and flexible wiring board. Wiring board and antenna board are made from one and the same insulating motherboard.

11 Claims, 15 Drawing Sheets

CARD TYPE INFORMATION DEVICE AND METHOD FOR MANUFACTURING SAME

RELATED APPLICATIONS

This application is the U.S. National Phase under 35 U.S.C. §371 of International Application No. PCT/JP2007/053475, filed on Feb. 26, 2007, which in turn claims the benefit of Japanese Application No. 2006-065360, filed on Mar. 10, 2006, the disclosures of which Applications are incorporated by reference herein.

TECHNICAL FIELD

The present invention relates to a card type information device, more particularly, it relates to an SD (Secure Digital) memory card (registered trade mark) having an antenna function, and a method of manufacturing the same card type information device.

BACKGROUND ART

In recent years, a memory card has been well accepted in the market as a semiconductor memory media having a large storage capacity. The memory card is widely used in portable digital devices such as digital cameras, portable music players, and portable information terminals. In order to use the memory card in the broader range of fields, the memory card has been required to have a wireless communication function.

An SD memory card with a wireless interface function is disclosed in, e.g. patent document 1 as a product satisfying the foregoing requirement. This SD memory card disclosed in patent document 1 is described hereinafter with reference to FIG. 15 and FIG. 16. FIG. 15 shows a schematic diagram illustrating a structure of the memory card disclosed in patent document 1, and FIG. 16 shows a perspective view illustrating an appearance of the SD memory card.

As shown in FIG. 15 and FIG. 16, SD memory card 1410 includes wireless controller 1430 besides the main function of memory medium, and antenna module 1420 equipped with antenna 1450 is coupled to wireless controller 1430 via connector 1440. Flash memory 1460 works as a flash ROM for the memory of SD memory card 1410 and also stores a driver program for operating the wireless communication function.

An electronic device, such as a portable digital device, equipped with SD card 1410 coupled to antenna module 1420 is capable of communicating with an external wireless communicating device without any special operation. In patent document 1 discussed above discloses that antenna module 1420 is retrofitted to an end of SD memory card 1410. Another example is also disclosed: antenna 1450 is built in SD memory card 1410 along the end face opposite to another end face where an external connecting terminal is disposed so that the housing of SD memory card can be free from any protrusions therefrom.

On the other hand, an electronic circuit module including multiple circuit boards is downsized by covering a first face of each one of the multiple boards with one sheet of a double-sided flexible circuit board so that each one of the multiple circuit boards can be coupled together mechanically and electrically. This technique is disclosed in, e.g. patent document 2. Since the double-sided flexible circuit board can be bent, the foregoing structure allows layering or folding the multiple circuit boards.

SD memory card 1410 disclosed in patent document 1; however, is retrofitted with antenna module 1420 at its end, so that its outer dimensions become greater by the size of antenna module 1420. In order to solve this problem, another example is disclosed: the SD memory card is equipped with an antenna built therein along its end face opposite to another end face where an external connecting terminal is disposed. This structure can work at 2.4 GHz band which is specified in the example; however, in the case of using 13.56 MHz band, a longer antenna is needed, so that it is difficult to place the antenna along the end face.

According to patent document 2, use of the double-sided flexible circuit board for covering a first face of each one of the multiple circuit boards allows coupling the multiple circuit boards together electrically and mechanically; however, patent document 2 is not disclosed about a wireless function such as an antenna, or problems of degrading the wireless function as well as measures to overcome the problems.

Patent document 1: Unexamined Japanese Patent Publication No. 2001-195553

Patent document 2: Unexamined Japanese Patent Publication No. H04-233786

DISCLOSURE OF INVENTION

A card type information device of the present invention includes the following elements:
 a wiring board including a wiring pattern having at least one electronic component mounted to at least a first face of the wiring board, and an antenna connecting electrode;
 an antenna board on which first face an antenna pattern including an antenna terminal electrode is formed;
 a magnetic material disposed between a second face of the wiring board and a second face of the antenna board, both of the second faces confronting each other;
 a flexible wiring board for coupling the antenna connecting electrode to the antenna terminal electrode; and
 a housing for accommodating at least the wiring board, the antenna board, the magnetic material, and the flexible wiring board.

The wiring board is formed of the same insulating motherboard as that of the antenna board.

The foregoing structure allows achieving a card type information device accommodated in a housing having the dimensions specified by the industry standard with an antenna built in the device free from degrading transmission/reception performance of the antenna. The built-in antenna is long enough for the wireless communication at 13.56 MHz band.

A method of manufacturing the card type information device of the present invention includes:
 forming an antenna connecting electrode, a wiring pattern, and an antenna pattern including an antenna terminal electrode in a given region on an insulating motherboard
 forming a slit part on the insulating motherboard in parts for forming an antenna board which includes the antenna pattern having the antenna terminal electrode on a first face of the antenna board and forming a wiring board having the wiring pattern and the antenna connecting electrode on a first face of the wiring board;
 mounting at least one electronic component to the wiring pattern of the wiring board, and coupling the antenna connecting electrode of the wiring board to the antenna terminal electrode of the antenna board with a flexible wiring board;
 providing a second face of one of the antenna board or the wiring board with magnetic material;

separating the antenna board and the wiring board from the insulating motherboard;

folding the wiring board over the antenna board with a second face of the wiring board confronting the magnetic material disposed on the antenna board; and accommodating at least the wiring board, the antenna board, the magnetic material, and the flexible wiring board, in a housing.

The foregoing manufacturing method allows manufacturing a card type information device accommodated in the housing having the shape and the dimensions specified by the industry standard at a lower cost with an antenna built in the device free from degrading transmission/reception performance of the antenna. The built-in antenna is capable of implementing the wireless communication at 13.56 MHz band.

Figure 1A:
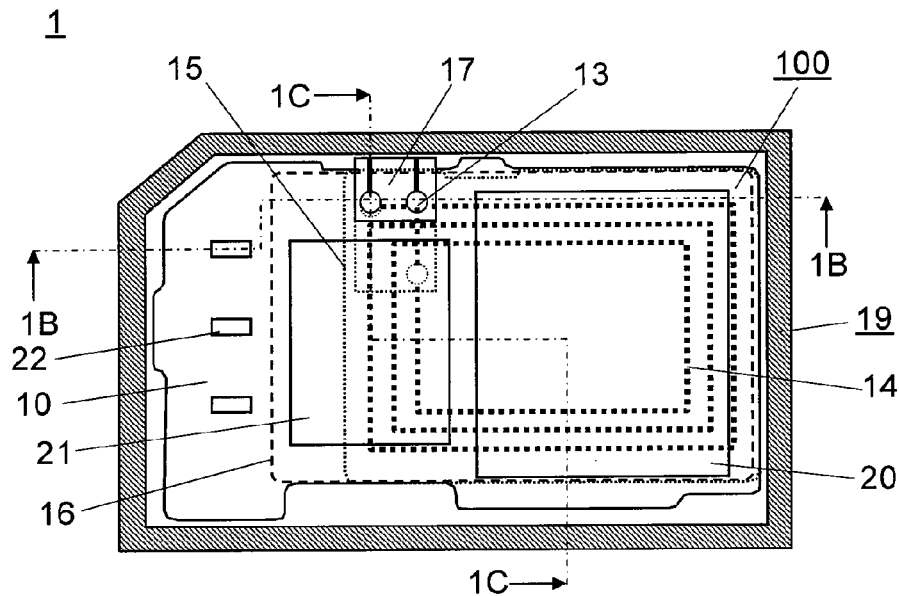
FIG. 1A shows a plan view schematically illustrates a structure of a card type information device in accordance with a first exemplary embodiment of the present invention.

DESCRIPTION OF REFERENCE MARKS 1, 2, 3, 4, 5, 6, 7: card type information device (SD memory card)
10, 40, 50: wiring board
10A, 15A: first face
10B, 15B: second face
10C, 15C, 50C, 55C: end face
11: wiring pattern
11A: connecting terminal
12: antenna connecting electrode
13: antenna terminal electrode
14: antenna pattern
15, 55: antenna board
15E: protecting layer
16: magnetic material
16B: adhesive
17: flexible wiring board
17A: lead-wiring pattern
17B: conductive via
18: external connecting terminal
19, 49, 69: housing
19A, 49A, 69A: upper housing
19B, 49B, 69B: lower housing
19C: hole
20: semiconductor memory element
21: control circuit element
22: capacitor
30: insulating motherboard (motherboard)
31, 31A: slit part
32: bridge
100, 200, 300, 400, 500: solid circuit module
691A, 691B: protrusion

DESCRIPTION OF PREFERRED EMBODIMENTS

Exemplary embodiments of the present invention are demonstrated hereinafter with reference to the accompanying drawings. The exemplary embodiments use an SD memory card having outer dimensions of 24 mm×32 mm×2.1 mm specified by the industry standard.

First Exemplary Embodiment

Figure 1B:
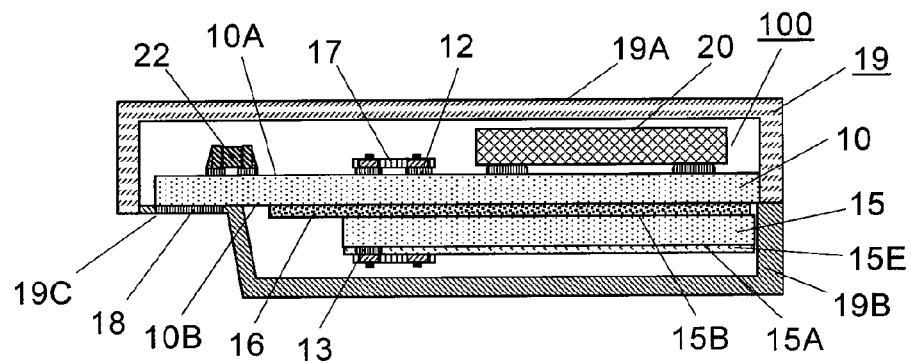
FIG. 1B shows a sectional view schematically illustrates a structure of the card type information device cut along line 1B-1B shown in FIG. 1A in accordance with the first exemplary embodiment of the present invention.
Figure 1C:
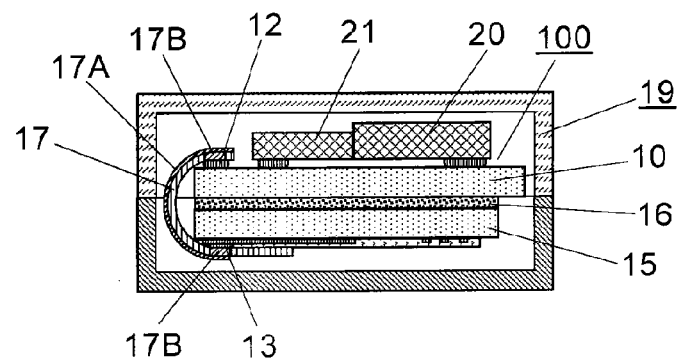
FIG. 1C shows a sectional view schematically illustrates a structure of the card type information device cut along line 1C-1C shown in FIG. 1A in accordance with the first exemplary embodiment of the present invention.

FIG. 1A shows a plan view schematically illustrates a structure of a card type information device (hereinafter referred to as SD memory card) in accordance with the first exemplary embodiment of the present invention. FIG. 1B shows a sectional view cut along line 1B-1B in FIG. 1A. FIG. 1C shows a sectional view cut along line 1C-1C in FIG. 1A. In FIG. 1A, an upper section of the housing is omitted in order to show the interior structure more clearly.

As shown in FIG. 1A, SD memory card 1 has outer dimensions of 24 mm×32 mm×2.1 mm specified by the industry standard and includes housing 19 made of a polymer alloy of polycarbonate and ABS resin. Housing 19 accommodates the following elements:

wiring board 10 including a wiring pattern (not shown) having multiple electronic components, e.g. semiconductor memory elements, and control circuit elements mounted on first face 10A of wiring board 10, and antenna connecting electrode 12; and antenna board 15 of which first face 15A includes antenna pattern 14 having antenna terminal electrode 13.

Wiring board 10 and antenna board 15 are formed of the same insulating motherboard (hereinafter referred to simply as "motherboard") made from, e.g. glass epoxy resin having a thickness, e.g. 100 μm-300 μm. Magnetic material 16 is sandwiched between second face 10B of wiring board 10 and second face 15B of antenna board 15, so that second face 10B confronts second face 15B. Antenna connecting electrode 12 of wiring board 10 is coupled to antenna terminal electrode 13 of antenna board 15 via flexible wiring board 17.

The foregoing structure allows housing 19 to accommodate at least wiring board 10, antenna board 15, magnetic material 16, and flexible wiring board 17 coupled to each other mechanically and electrically.

Wiring board 10 formed of the motherboard made from, e.g. glass epoxy resin includes a wiring pattern made of copper foil and formed on at least first face 10A of wiring board 10. The wiring pattern has connecting terminals (not shown) to which multiple electronic components are coupled by soldering, such as semiconductor memory element 20, control circuit element 21 having a thickness ranging from 50 μm-150 μm or capacitor 22 having a typical thickness of 300 μm. Wiring board 10 also includes antenna connecting electrode 12 for connecting to antenna terminal electrode 13 of antenna pattern 14 formed on antenna board 15.

Semiconductor memory element 20 employs, e.g. a flash memory, and can have a capacity as great as 1 GB or 2 GB by using a high density mounting technique which allows arranging the flash memories in two lines by four rows.

The semiconductor memory element, control circuit element, capacitor and so on discussed above can be integrated into one electronic component.

As shown in FIG. 1B, wiring board 10 includes external connecting terminal 18 connected, through a conductive via hole, to a wiring pattern to be connected to an external device (not shown) at a given section of housing 19 specified by the industry standard. External connecting terminal 18 is placed corresponding to a position of hole 19C of housing 19. This structure allows supplying electric power from an external device, so that the SD memory card can be used for a sophisticated application free from worries about increment in power consumption due to, e.g. high speed transmission of input/output information.

Antenna board 15, formed of the same motherboard as used for wiring board 10, includes antenna pattern 14 and antenna terminal electrode 13 on its first face 15A. Antenna pattern 14 has a length conforming to a wavelength of, e.g. 13.56 MHz band, and is made of copper or silver. Antenna pattern 14 can be covered with protective layer 15E made of insulating resin, e.g. resist, for improving the reliability including humidity resistance.

On top of that, magnetic material 16 having a thickness ranging from 50 μm-200 μm is sandwiched between second face 10B of wiring board 10 and second face 15B of antenna board 15. Magnetic material 16 can employ a metallic oxide with magnetic properties such as chrome oxide, nickel oxide, or ceramic member. Magnetic material 16 can also employ a sheet formed by mixing magnetic powder such as ferrite powder with synthetic rubber or resin.

Magnetic material 16 sandwiched between second face 10B of wiring board 10 and second face 15B of antenna board 15 prevents the incoming radio wave to the antenna pattern from reflecting on the electronic components placed on wiring board 10 confronting antenna board 15. This structure thus allows preventing the performance of transmission/reception of the antenna from degrading. Magnetic material 16 is preferably disposed to cover the entire second face 15B of antenna board 15, so that the whole antenna pattern can be covered with magnetic material 16. As a result, the degradation of transmission/reception performance of the antenna can be further limited.

Magnetic material 16 sandwiched between second face 10B of wiring board 10 and second face 15B of antenna board 15 is preferably placed corresponding to a region where at least the multiple electronic components, such as semiconductor memory element 20, control circuit element 21, are mounted to wiring board 10. This structure allows eliminating the reflection of radio wave on the electronic components mounted wherever to the wiring board confronting the antenna board. As a result, the degradation of transmission/reception performance of the antenna can be further limited.

The dimensions of the antenna board, the magnetic material, and the wiring board can be greater in this order. This structure is advantageous to the stabilization of the antenna characteristics or the accommodation of these elements in the housing which should meet the industry standard.

Flexible wiring board 17 is formed of insulating resin film made of, e.g. polyimide resin, and lead-wire pattern 17A, conductive via 17B and so on are patterned on the insulating resin film. Antenna connecting electrode 12 and antenna terminal electrode 13 are coupled to flexible wiring board 17 with, e.g. solder through conductive via 17B. Wiring board 10 and antenna board 15 confronting each other with magnetic material 16 sandwiched therebetween are thus electrically coupled together via flexible wiring board 17, so that solid (three dimensional) circuit module 100 is completed. Solid circuit module 100 is accommodated in housing 19 which is formed of upper housing 19A and lower housing 19B, both of which are molded of, e.g. a polymer alloy of polycarbonate and ABS resin, and have a lid on their respective one face.

The structure discussed above thus compactly accommodates at least wiring board 10 on which electronic components are mounted, antenna board 15 having antenna pattern 14 to be used for wireless communication, magnetic material 16 sandwiched by wiring board 10 and antenna board 15 that are thus layered together, and flexible wiring board 17 for electrically coupling wiring board 10 to antenna board 15 in housing 19 complying with the outer dimensions specified by the industry standard.

In other words, the foregoing structure allows the housing, which complies with the industry standard in terms of the dimensions, to accommodate compactly an SD memory card including the magnetic material with an antenna for wireless communication built therein. The SD memory card is thus free from degradation in transmission/reception performance.

In this first exemplary embodiment, the flexible wiring board made of insulating resin film has a lead-wire pattern on the insulating resin film face confronting the housing, and the lead-wire pattern is coupled to the antenna terminal electrode and antenna connecting electrode through the conductive via; however, the present invention is not limited to this example. For instance, the lead-wire pattern can be formed on the insulating resin film face confronting the magnetic material, and then the lead-wire pattern is coupled directly to the antenna connecting electrode and the antenna terminal electrode without preparing the conductive via. Here is another example: the lead-wire pattern can be sandwiched between the faces of the insulating resin film, and only the antennae terminal electrode is exposed from the flexible wiring board. These instances allow eliminating the conductive via on the flexible wiring board. In these cases, a protective layer is desirably prepared for the elements except the antenna terminal electrode formed on the antenna pattern.

A method of manufacturing the SD memory card in accordance with the first exemplary embodiment is detailed hereinafter with reference to FIG. 2A-FIG. 5C, which schematically illustrate the manufacturing method of the SD memory card. FIG. 2A-FIG. 2C and FIG. 4A-FIG. 4C are plan views schematically illustrating the manufacturing method, and FIG. 3A-FIG. 3C and FIG. 5A-FIG. 5C are sectional views illustrating some steps shown in FIG. 2A-2C and FIG. 4A-4C. FIG. 4A shows a plan view illustrating the motherboard viewed from the face on which magnetic material is formed.

Figure 2A:
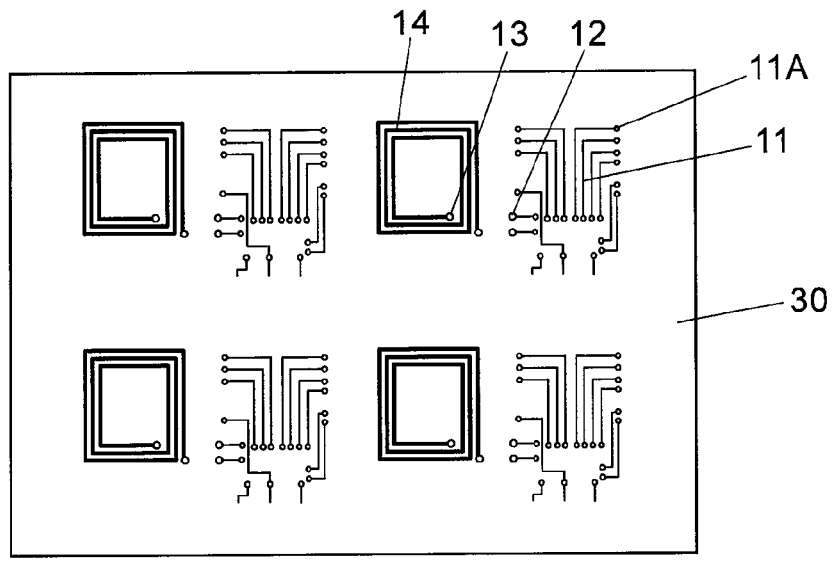
FIG. 2A shows a plan view schematically illustrating a manufacturing method of the card type information device in accordance with the first exemplary embodiment of the present invention.
Figure 3A:
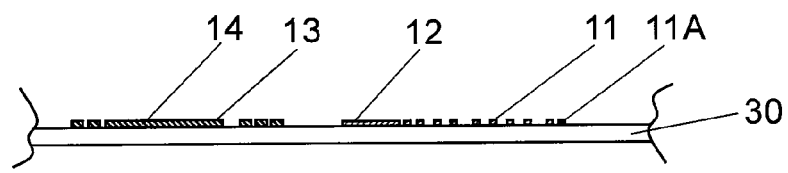
FIG. 3A shows a sectional view schematically illustrating a part of the card type information device shown in FIG. 2A.
Figure 4A:
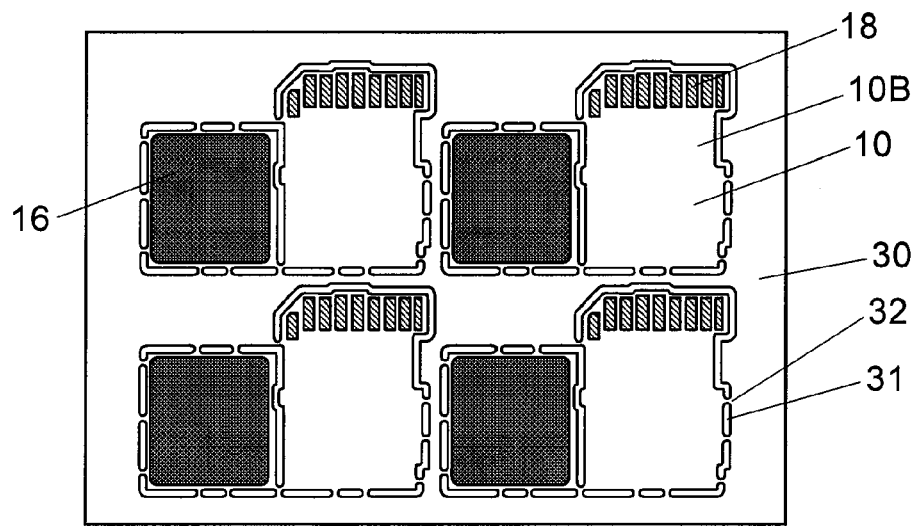
FIG. 4A shows a plan view schematically illustrating a manufacturing method of the card type information device in accordance with the first exemplary embodiment of the present invention.

First as shown in FIG. 2A and FIG. 3A, at a given region on a first face of motherboard 30 made of glass epoxy resin having 200 μm thickness, antenna pattern 14 including antenna terminal electrode 13, wiring pattern 11, connecting terminal 11A, and antenna connecting electrode 12 to be coupled to antenna terminal electrode 13 of antenna pattern 14 are formed as one unit, and a plurality of the units is formed at this given region. On top of that, external connecting terminals 18, coupled to the wiring pattern through the conductive via, are formed on second face 10B of wiring board 10 for connecting to an external device (not shown).

Wiring pattern 11, antenna pattern 14, antenna terminal electrode 13, antenna connecting electrode 12, and connecting terminal 11A can be formed, e.g. in 25-50 μm thickness by the following methods: etching a copper or aluminum foil, or a copper or aluminum film for forming patterns; plating a metallic film on a conductive layer on which patterns are formed; screen-printing a conductive paste; or applying and hardening the conductive paste. Gold plating can be provided, or a protective layer of resist can be formed if it is needed. Meanwhile, antenna pattern 14 is formed corresponding to the length of an antenna conforming to a required frequency, e.g. 13.56 MHz band.

Figure 2B:
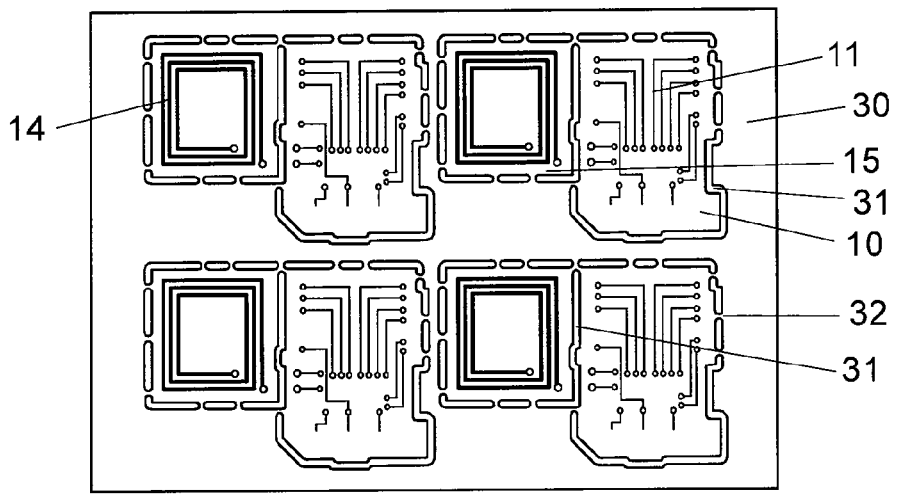
FIG. 2B shows a plan view schematically illustrating a manufacturing method of the card type information device in accordance with the first exemplary embodiment of the present invention.
Figure 3B:
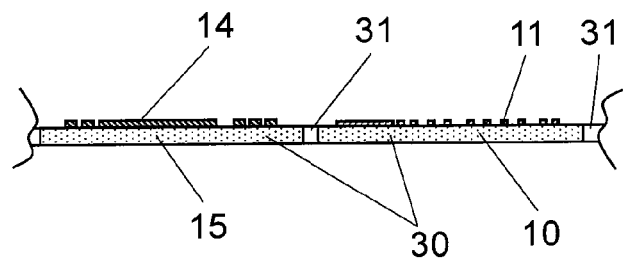
FIG. 3B shows a sectional view schematically illustrating a part of the card type information device shown in FIG. 2B.

Next, as shown in FIGS. 2B and 3B, slit part 31 is formed on motherboard 30 for forming and defining antenna board 15 and wiring board 10, and slit part 31 has a width at least greater than the thickness of the magnetic material. Antenna board 15 and wiring board 10 defined by slit part 31 are handled as one unit, and antenna board 15 includes antenna pattern 14 having antenna terminal electrode 13 on its first face, and wiring board 10 includes wiring pattern 11 and antenna connecting electrode 12 on its first face. Slit part 31 is formed like a slit at multiple places; except the section where the flexible wiring board is provided in the step described later, however, it is still coupled to motherboard 30 with bridge 32.

Slit-like slit part 31 can be formed by the following methods available in general: punching out the motherboard by pressing or punching; or cutting the motherboard with a drill.

Slit-like slit part 31 is preferably formed to have a width not smaller than the thickness, e.g. 100 μm, of magnetic material 16. This preparation allows folding the flexible wiring board free from distortion for coupling the antenna board to the wiring board with magnetic material 16 sandwiched between the antenna board and the wiring board.

Figure 2C:
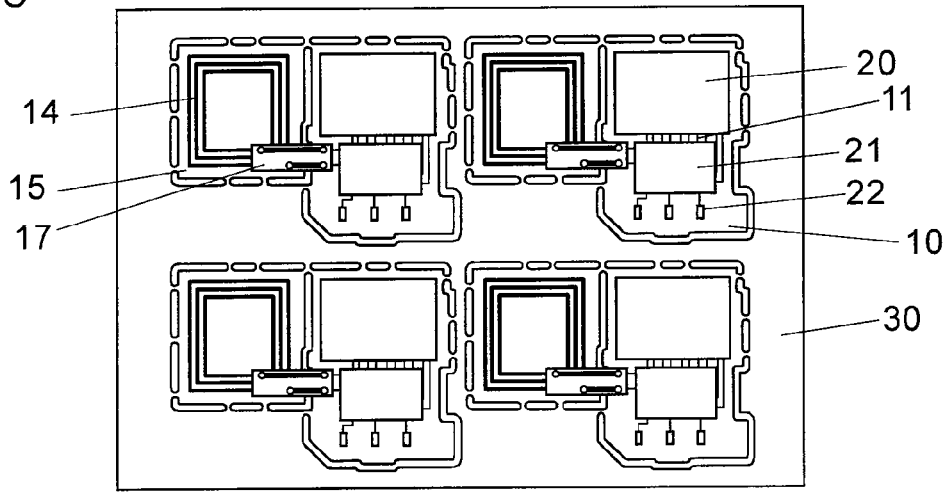
FIG. 2C shows a plan view schematically illustrating a manufacturing method of the card type information device in accordance with the first exemplary embodiment of the present invention.
Figure 3C:
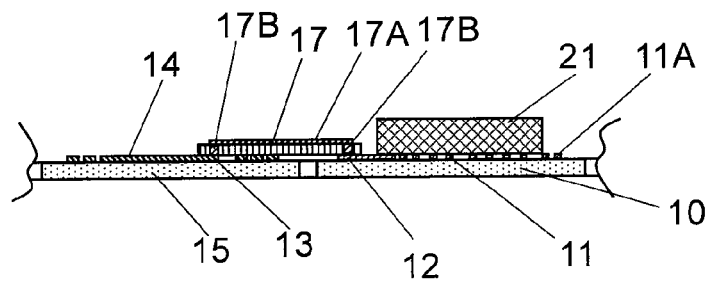
FIG. 3C shows a sectional view schematically illustrating a part of the card type information device shown in FIG. 2C.

Then as shown in FIGS. 2C and 3C, multiple electronic components are mounted to connecting terminals 11A of wiring pattern 11 formed on wiring board 10, and antenna connecting electrode 12 of wiring board 10 is coupled to antenna terminal electrode 13 formed on antenna board 15 with flexible wiring board 17. Then electronic components such as semiconductor memory element 20, control circuit element 21, capacitor 22 are placed at given mounting places on wiring board 10. Flexible wiring board 17 including lead-wire pattern 17A formed by copper foil, or copper plating on the polyimide resin film and conductive via 17B is placed such that the positions of antenna connecting electrode 12 of wiring board 10 and antenna terminal electrode 13 of antenna board 15 agree with each other. The construction discussed above then undergoes, e.g. a reflow process, so that the multiple electronic components are soldered to wiring board 10, and antenna connecting electrode 12 of wiring board 10 is coupled to antenna terminal electrode 13 of antenna board 15 through conductive via 17B.

Figure 5A:
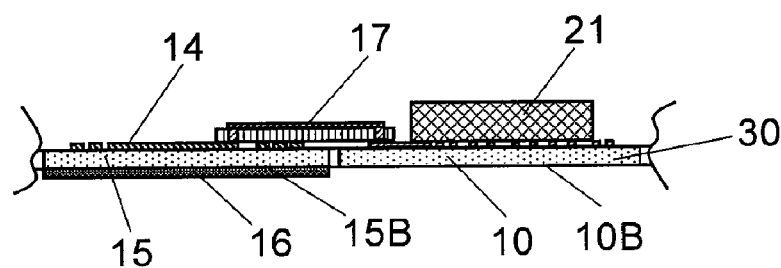
FIG. 5A shows a sectional view schematically illustrating a part of the card type information device shown in FIG. 4A.

Next, as shown in FIGS. 4A and 5A, magnetic material 16 having a thickness of 0.1 mm and made of, e.g. ferrite, is stuck to second face 15B of antenna board 15 with an adhesive or a binder (not shown). Not to mention, magnetic material 16 can be stuck to second face 10B, confronting antenna board 15, of wiring board 10.

Figure 4B:
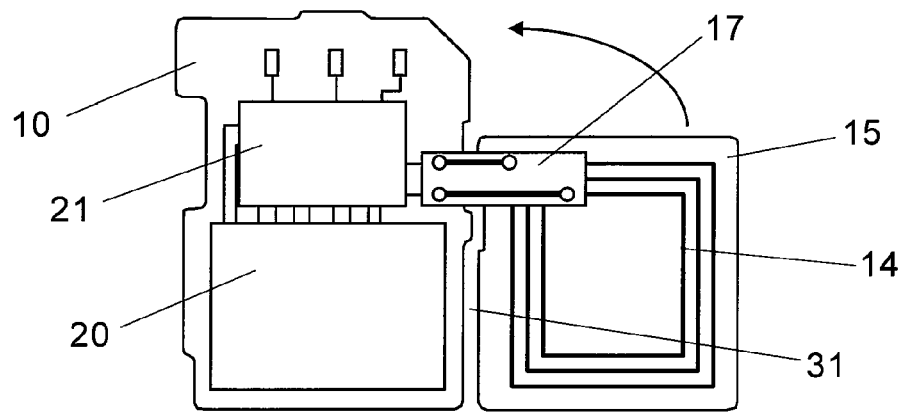
FIG. 4B shows a plan view schematically illustrating a manufacturing method of the card type information device in accordance with the first exemplary embodiment of the present invention.
Figure 5B:
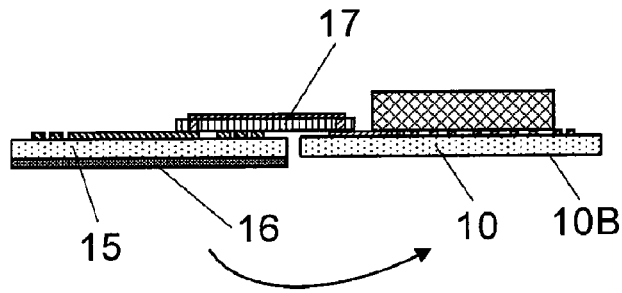
FIG. 5B shows a sectional view schematically illustrating a part of the card type information device shown in FIG. 4B.

Next, as shown in FIGS. 4B and 5B, antenna board 15 and wiring board 10 as one unit are separated from motherboard 30 along slit part 31 and bridge 32 shown in FIG. 4A by using, e.g. a punching machine. Then wiring board 10 and antenna board 15 coupled by flexible wiring board 17 are folded along the arrow mark shown in FIGS. 4B and 5B such that second face 10B of wiring board 10 confronts magnetic material 16 formed on antenna board 15. At this time, flexible wiring board 17, which couples wiring board 10 to antenna board 15 mechanically and electrically, bends, e.g. roundly while it covers end faces of both wiring board 10 and antenna board 15 in parts.

Figure 4C:
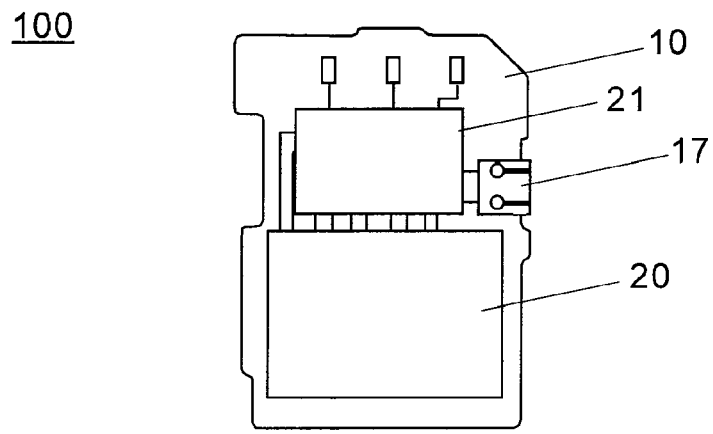
FIG. 4C shows a plan view schematically illustrating a manufacturing method of the card type information device in accordance with the first exemplary embodiment of the present invention.
Figure 5C:
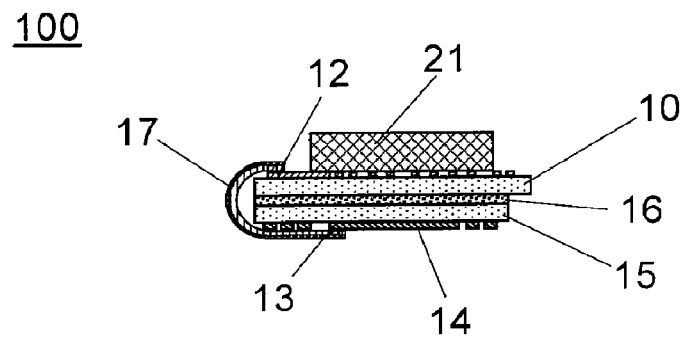
FIG. 5C shows a sectional view schematically illustrating a part of the card type information device shown in FIG. 4C.

Then as shown in FIGS. 4C and 5C, solid circuit module 100 is compactly formed by folding wiring board 10 and antenna board 15 with magnetic material 16 sandwiched therebetween by using flexible wiring board 17 which couples wiring board 10 to antenna board 15. Solid circuit module 100 is then accommodated in housing 19 for completing SD memory card 1 as shown in FIG. 1A.

The manufacturing method in accordance with the first exemplary embodiment proves that the antenna boards and the wiring boards formed of an identical motherboard can be coupled each other through a flexible wiring board, and the multiple electronic components can be mounted at the same time because of undergoing the reflow process. As a result, the SD memory card can be manufactured at a lower cost and at a higher productivity.

Use of the flexible wiring board allows folding the antenna board over the wiring board, so that a solid circuit module formed of the antenna board, the wiring board, and the magnetic material can be assembled with ease. As a result, the working efficiency in the manufacture of the SD memory card can be greatly improved.

Use of the slit part having a width greater than a thickness of the magnetic material allows the flexible wiring board to be free from distortion when the flexible wiring board, which couples the antenna board to the wiring board with the magnetic material therebetween, is folded. As a result, a reliable SD memory card free from a disconnection in lead-wire patterns or a break away of the antenna connecting electrode can be obtained.

In this exemplary embodiment, the wiring patterns are formed on the motherboard before the slit parts are formed; however, the present invention is not limited to this example. For instance, the slit parts are formed on the motherboard, and then the wiring patterns can be formed. In this case, formation of slit parts does not adversely affects the wiring patterns such as stress strain or deformation, so that an SD memory card with higher reliability is obtainable.

Second Exemplary Embodiment

Figure 6A:
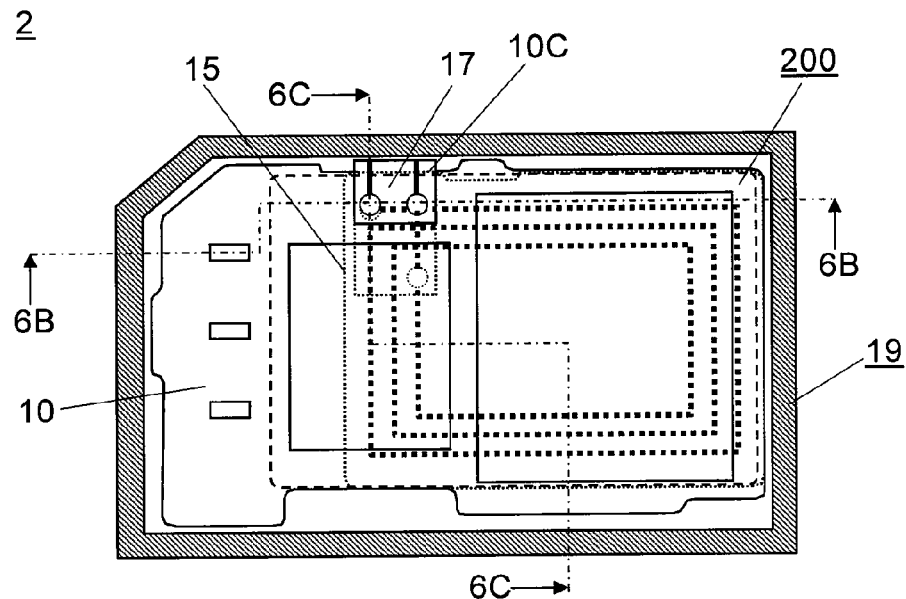
FIG. 6A shows a plan view schematically illustrates a structure of a card type information device in accordance with a second exemplary embodiment of the present invention.
Figure 6B:
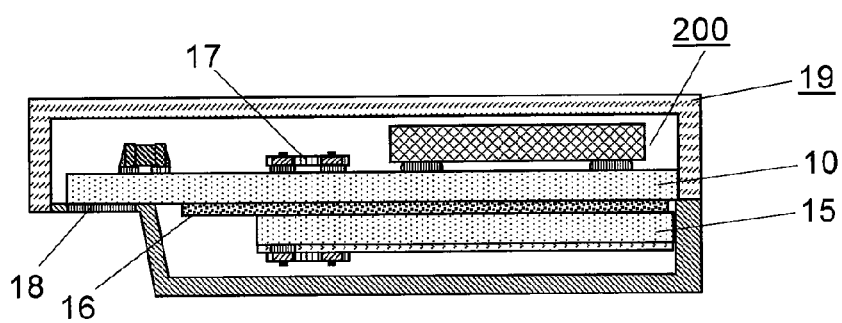
FIG. 6B shows a sectional view schematically illustrates a structure of the card type information device cut along line 6B-6B shown in FIG. 6A in accordance with the second exemplary embodiment of the present invention.
Figure 6C:
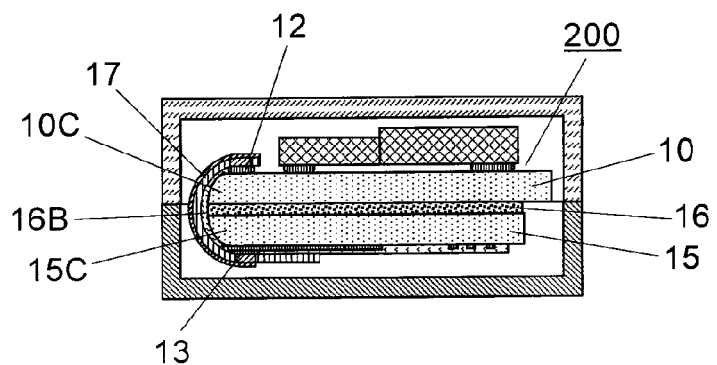
FIG. 6C shows a sectional view schematically illustrates a structure of the card type information device cut along line 6C-6C shown in FIG. 6A in accordance with the second exemplary embodiment of the present invention.

FIG. 6A shows a plan view schematically illustrates a structure of an SD memory card in accordance with the second exemplary embodiment of the present invention. FIG. 6B shows a schematic sectional view cut along line 6B-6B shown in FIG. 6A, and FIG. 6C shows a schematic sectional view cut along line 6C-6C shown in FIG. 6A. In FIG. 6A, an upper section of the housing is omitted in order to clearly show the interior structure. In FIG. 6A-FIG. 6C, similar elements to those in FIG. 1A-FIG. 1C have the same reference marks as those in FIG. 1A-FIG. 1C.

As shown in FIG. 6A-FIG. 6C, SD memory card 2 in accordance with the second exemplary embodiment differs from SD memory card 1 shown in FIG. 1A-FIG. 1C in the following point: Wiring board 10 and antenna board 15 of SD memory card 2 have a curved end face at least at a section where both wiring board 10 and antenna board 15 are coupled together through flexible wiring board 17.

To be more specific, as shown in FIG. 6C, SD memory card 2 includes solid circuit module 200 which is formed of wiring board 10 and antenna board 15, and wiring board 10 is coupled to antenna board 15 at end face 10C and end face 15C through flexible wiring board 17. At least end faces 10C and 15C are rounded to be, e.g. ¼ circle. On top of that, flexible wiring board 17 can be fixed to end face 10C of wiring board 10 and end face 15C of antenna board 15 with, e.g. rubber-based or epoxy-based adhesive 16B when necessary.

The curved face is preferably shaped such that it goes along the folded flexible wiring board 17, or end face 10C of wiring board 10 and end face 15C of antenna board 15 can be chamfered off to fit the folded flexible wiring board 17. Here is another option, i.e. when wiring board 10 and antenna board 15 are folded, the curved faces can be shaped semi-circular or a part of the semi-circle.

The foregoing structure allows end face 10C of wiring board 10 and end face 15C of antenna board 15 to have a curved face free from sharp-edged sections at least at the parts where flexible wiring board 17 is bent, so that flexible wiring board 17 can avoid being damaged during the manufacture or the operation of SD memory card 2. As a result, highly reliable SD memory card 2 is obtainable.

In this exemplary embodiment, flexible wiring board 17 is fixed to the end faces with adhesive 16B; however, the present invention is not limited to this example. For instance, when magnetic material 16 is bonded with adhesive put between wiring board 10 and antenna board 15, the adhesive sticking out from end face 10C of wiring board 10 and end face 15C of antenna board 15 can be used for fixing flexible wiring board 17 to the end faces. Fixation of flexible wiring board to the end faces improves the mechanical strength and the connection reliability.

A method of manufacturing SD memory card 2 is demonstrated hereinafter with reference to FIG. 7A-FIG. 8C, which are sectional views schematically illustrate the manufacturing method of SD memory card 2. These Figs. show only a part of respective steps. In FIGS. 7A-7C and FIGS. 8A-8C, similar elements to those used in FIGS. 3A-3C and FIGS. 5A-5C have the same reference marks.

Figure 7A:
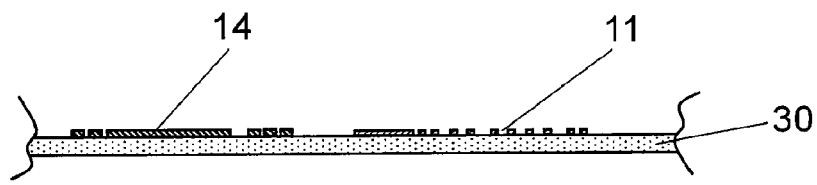
FIG. 7A shows a sectional view schematically illustrating a manufacturing method of the card type information device in accordance with the second exemplary embodiment of the present invention.

As shown in FIG. 7A-FIG. 8C, a step of forming slit parts on motherboard 30 in parts differs from the step shown in FIGS. 3A-3C and FIGS. 5A-5C in forming a curve on the end faces of the wiring board and the antenna board at least at the parts where both the wiring board and the antenna board are coupled together through the flexible wiring board. Firstly, as shown in FIG. 7A, the step of manufacturing SD memory card 2 is the same as the step shown in FIG. 3A, so that the description thereof is omitted here.

Figure 7B:
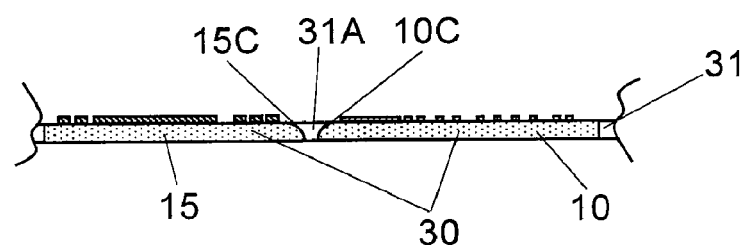
FIG. 7B shows a sectional view schematically illustrating a manufacturing method of the card type information device in accordance with the second exemplary embodiment of the present invention.

Next, as shown in FIG. 7B, slit part 31 having a width greater than the thickness of magnetic material 16 is formed on motherboard 30 in parts for defining antenna board 15 and wiring board 10 as one unit. Antenna board 15 includes antenna pattern 14 having antenna terminal electrode 13 on its first face, and wiring board 10 includes wiring pattern 11 and antenna connecting electrode 12 on its first face. Slit parts 31 are formed like slits such that a bridge (not shown) between the slits keeps connections in motherboard 30 except at the part where the flexible wiring board is placed in the step described later. At this time, in slit part 31 between wiring board 10 and antenna board 15, at least slit part 31A between end face 10C of wiring board 10 and end face 15C of antenna board 15 coupled together through flexible wiring board 17 is curved. A method of curving the end faces is to cut off the slit of slit part 31 into curved face with a drill having a shape fitting to the curve, so that slit part 31A can be formed.

The sectional views of end face 10C of wiring board 10 and end face 15C of antenna board 15 show a curve at the parts with which the flexible wiring board comes into contact when wiring board 10 and antenna board 15 are folded. The step of forming curved slit part 31A between end face 10C of wiring board 10 and end face 15C of antenna board 15 can be done before or after the step of forming slit part 31 on mother-board 30 in parts, or it can be done generally at the same time as the step of forming slit part 31.

Figure 7C:
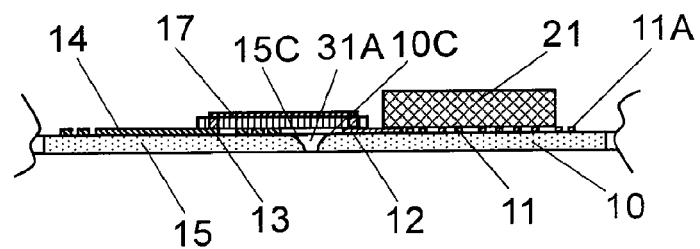
FIG. 7C shows a sectional view schematically illustrating a manufacturing method of the card type information device in accordance with the second exemplary embodiment of the present invention.

Next, as shown in FIG. 7C, multiple electronic components are mounted to connecting terminals 11A of wiring pattern 11 formed on wiring board 10, and antenna connecting electrode 12 of wiring board 10 is coupled to antenna terminal electrode 13 formed on antenna board 15 with flexible wiring board 17.

Then electronic components such as semiconductor memory element 20, control circuit element 21, capacitor 22 are placed at given mounting places on wiring board 10. Flexible wiring board 17 including lead-wire pattern 17A made of polyimide resin film, copper foil, or copper plating and conductive via 17B is placed such that the positions of antenna connecting electrode 12 and antenna terminal electrode 13 agree with each other. The construction discussed above then undergoes, e.g. a reflow process, so that the multiple electronic components are soldered to wiring board 10, and antenna connecting electrode 12 of wiring board 10 is coupled to antenna terminal electrode 13 of antenna board 15 through conductive via 17B.

Figure 8A:
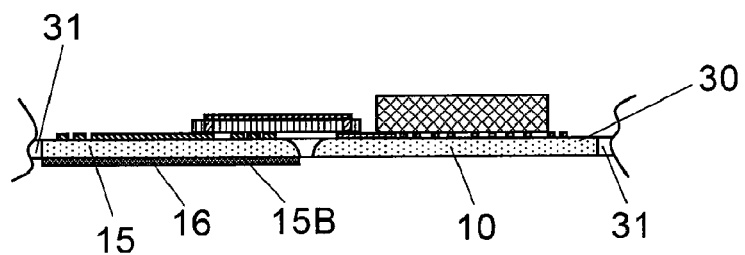
FIG. 8A shows a sectional view schematically illustrating a manufacturing method of the card type information device in accordance with the second exemplary embodiment of the present invention.

Then as shown in FIG. 8A, magnetic material 16 having a thickness of 0.1 mm and formed of, e.g. ferrite, is stuck to second face 15B of antenna board 15 with an adhesive or a binder (not shown). Not to mention, magnetic material 16 can be stuck to second face 10B, confronting antenna board 15, of wiring board 10.

Figure 8B:
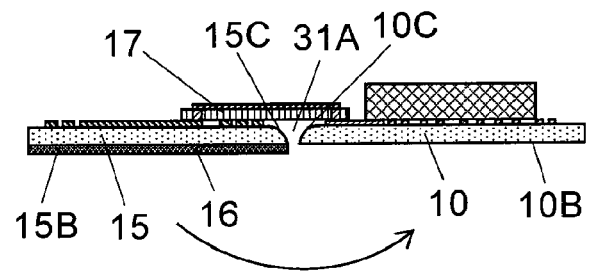
FIG. 8B shows a sectional view schematically illustrating a manufacturing method of the card type information device in accordance with the second exemplary embodiment of the present invention.

Next, as shown in FIG. 8B, antenna board 15 and wiring board 10 as one unit are separated by using, e.g. a punching machine from motherboard 30 at bridge 32 where slit parts 31 and 31A shown in FIG. 7B are connected. Then wiring board 10 and antenna board 15 coupled by flexible wiring board 17 are folded along the arrow mark shown in FIG. 8B such that second face 10B of wiring board 10 confronts magnetic material 16 formed on antenna board 15. At this time, flexible wiring board 17, which couples wiring board 10 to antenna board 15 mechanically and electrically, is deformed to fit to the shape of end face 10C of wiring board 10 and end face 15C of antenna board 15.

Figure 8C:
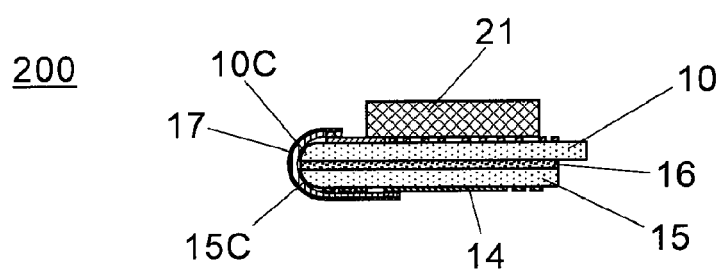
FIG. 8C shows a sectional view schematically illustrating a manufacturing method of the card type information device in accordance with the second exemplary embodiment of the present invention.

Then as shown in FIG. 8C, solid circuit module 200 is compactly formed by folding the wiring board 10 and antenna board 15 with magnetic material 16 sandwiched therebetween by using flexible wiring board 17 which couples wiring board 10 to antenna board 15. Solid circuit module 200 is then accommodated in housing 19 for completing SD memory card 2 as shown in FIG. 6A.

The manufacturing method in accordance with the second exemplary embodiment proves that a similar advantage to that of the first exemplary embodiment can be obtained and expected damage to the flexible wiring board can be prevented. As a result, a reliable SD memory card can be manufactured.

In this exemplary embodiment, the wiring patterns are formed on motherboard 30 before slit parts 31, 31A are formed; however, the present invention is not limited to this example. For instance, slit parts 31, 31A are formed on motherboard 30, and then the wiring patterns can be formed. In this case, formation of the slit parts does not adversely affects the wiring patterns such as stress strain or deformation, so that an SD memory card with higher reliability is obtainable.

Figure 9A:
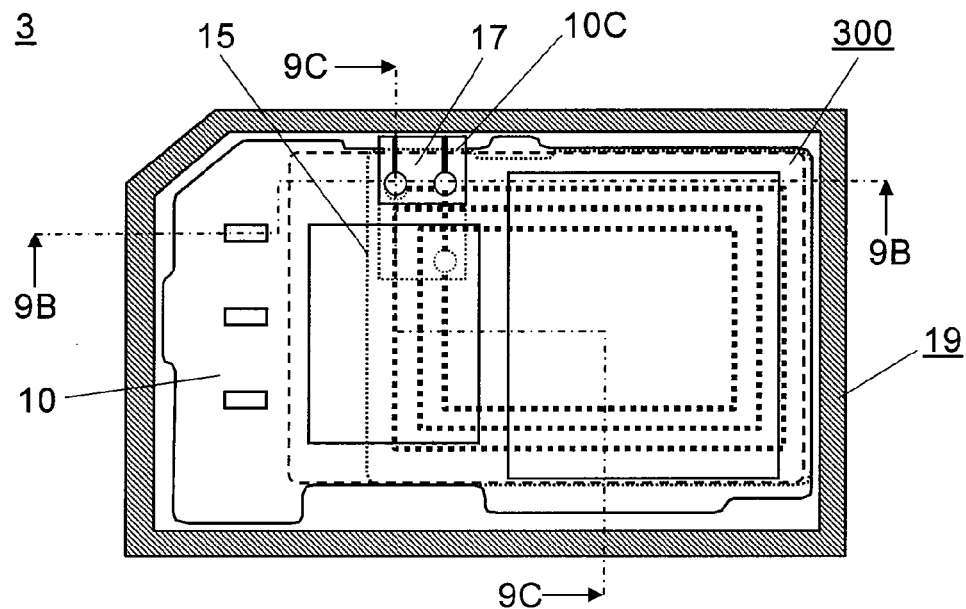
FIG. 9A shows a plan view schematically illustrates a structure of another card type information device in accordance with the second exemplary embodiment of the present invention.
Figure 9B:
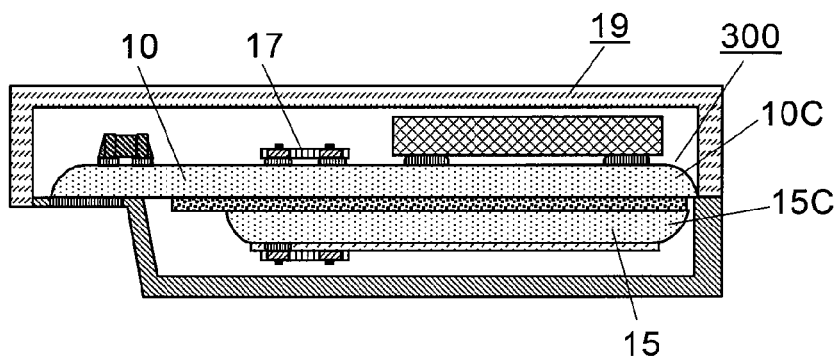
FIG. 9B shows a sectional view schematically illustrates a structure of the another card type information device cut along line 9B-9B shown in FIG. 9A in accordance with the second exemplary embodiment of the present invention.
Figure 9C:
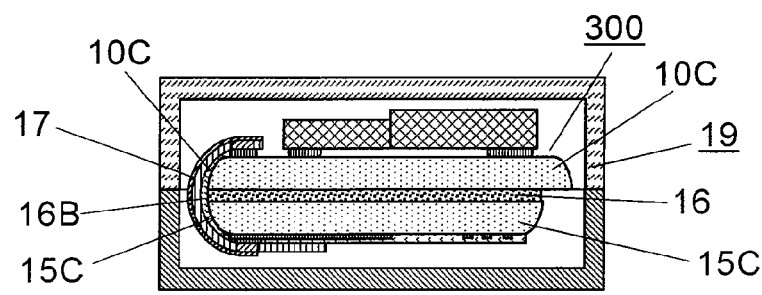
FIG. 9C shows a sectional view schematically illustrates a structure of the another card type information device cut along line 9C-9C shown in FIG. 9A in accordance with the second exemplary embodiment of the present invention.

In this exemplary embodiment, wiring board 10 and antenna board 15 are provided with a curved face only at end face 10C of wiring board 10 and end face 15C of antenna board 15 where flexible wiring board 17 is brought into contact; however, the present invention is not limited to this example. For instance, as shown in FIG. 9A-FIG. 9C, which show another example of the SD memory card in accordance with the second exemplary embodiment, at least all the slit parts between end face 10C of wiring board 10 and end face 15C of antenna board 15 can be provided with a curved face.

The present invention can be applied, not to mention, to SD memory card 3 including such solid circuit module 300.

Third Exemplary Embodiment

Figure 10A:
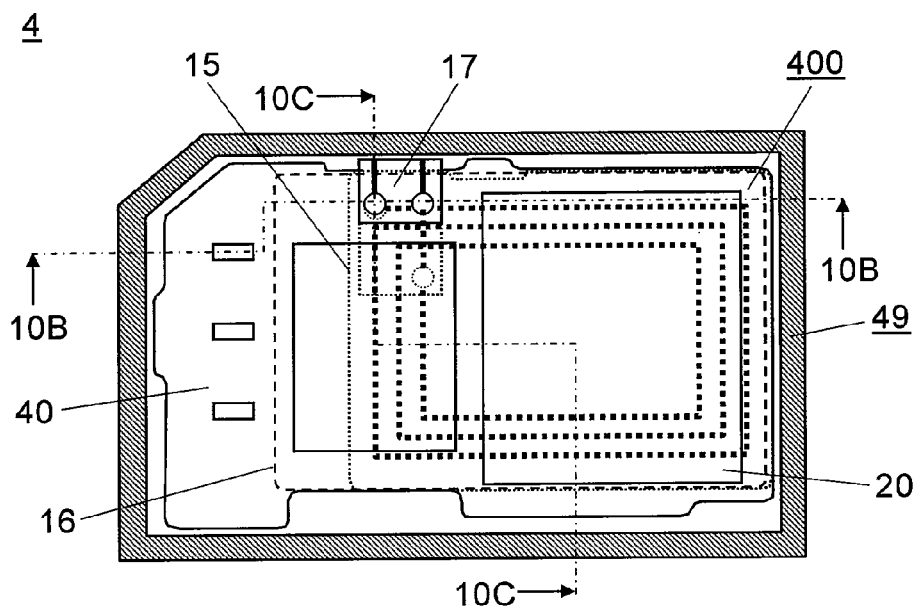
FIG. 10A shows a plan view schematically illustrates a structure of a card type information device in accordance with a third exemplary embodiment of the present invention.
Figure 10B:
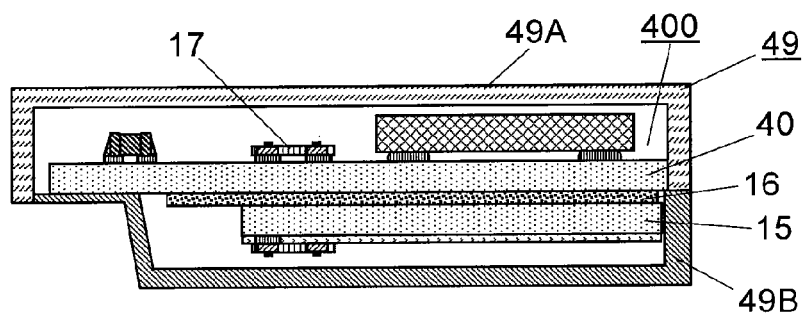
FIG. 10B shows a sectional view schematically illustrates a structure of the card type information device cut along line 10B-10B shown in FIG. 10A in accordance with the third exemplary embodiment of the present invention.
Figure 10C:
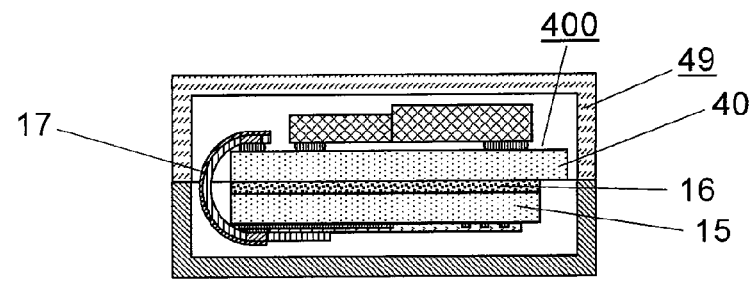
FIG. 10C shows a sectional view schematically illustrates a structure of the card type information device cut along line 10C-10C shown in FIG. 10A in accordance with the third exemplary embodiment of the present invention.

FIG. 10A shows a plan view schematically illustrates a structure of an SD memory card in accordance with the third exemplary embodiment of the present invention. FIG. 10B shows a schematic sectional view cut along line 10B-10B shown in FIG. 10A, and FIG. 10C shows a schematic sectional view cut along line 10C-10C shown in FIG. 10A. In FIG. 10A, an upper section of the housing is omitted in order to clearly show the interior structure. In FIG. 10A-FIG. 10C, similar elements to those in FIG. 1A-FIG. 1C have the same reference marks as those in FIG. 1A-FIG. 1C.

As shown in FIG. 10A-FIG. 10C, wiring board 10 differs from that shown in FIG. 1A-FIG. 1C in having no external connecting terminal, and the other structures remain unchanged from those in FIG. 1A-FIG. 1C. As shown in FIG. 10A-FIG. 10C, solid circuit module 400 of SD memory card 4 has no external connecting terminal at wiring board 40 for connecting to an external device through housing 49, so that no hole is needed to housing 49 formed of upper housing 49A and lower housing 49B.

The foregoing structure allows housing 49 to prevent dust or liquid from entering therein from the external environment. As a result, the reliability about the environment and durability can be greatly improved. Since SD memory card 4 has no external connecting terminal, it can be strong against static electricity and EMI (electromagnetic interference). Having no external connecting terminal, SD memory card 4 inputs or outputs information wirelessly.

Another example of the SD memory card in accordance with the third exemplary embodiment is demonstrated hereinafter with reference to FIG. 11A-FIG. 11C.

Figure 11A:
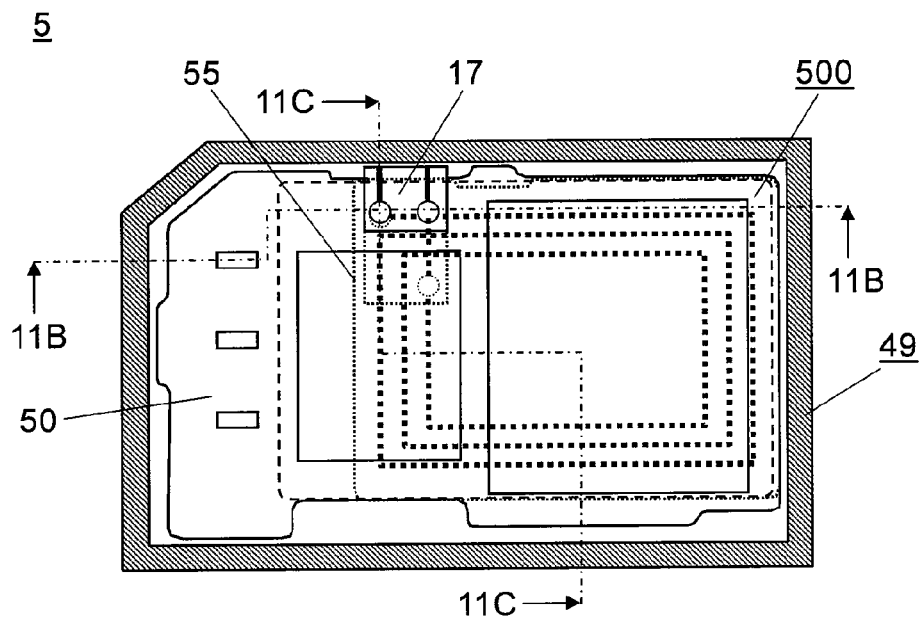
FIG. 11A shows a plan view schematically illustrates a structure of another card type information device in accordance with the third exemplary embodiment of the present invention.

FIG. 11A shows a plan view schematically illustrates a structure of another SD memory card in accordance with the third exemplary embodiment of the present invention.

Figure 11B:
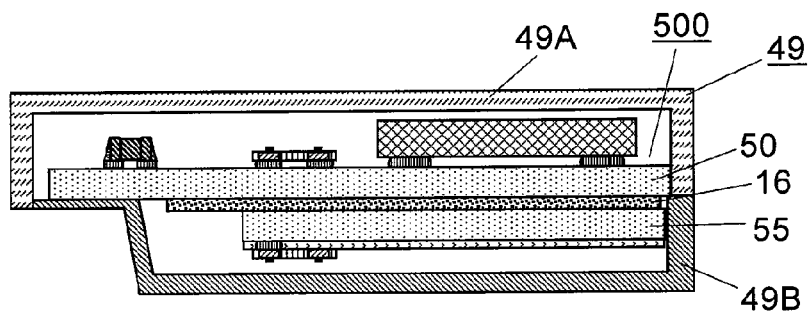
FIG. 11B shows a sectional view schematically illustrates a structure of the another card type information device cut along line 11B-11B shown in FIG. 11A in accordance with the third exemplary embodiment of the present invention.
Figure 11C:
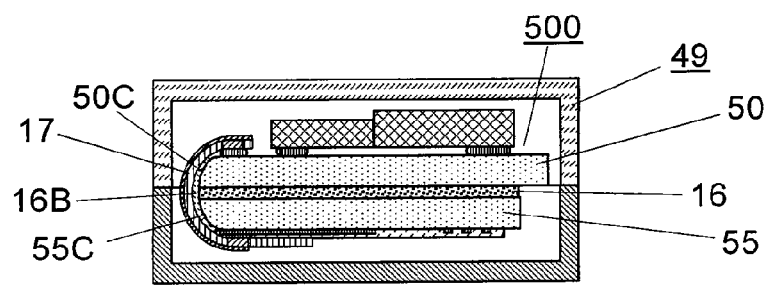
FIG. 11C shows a sectional view schematically illustrates a structure of the another card type information device cut along line 11C-11C shown in FIG. 11A in accordance with the third exemplary embodiment of the present invention.

FIG. 11B shows a schematic sectional view cut along line 11B-11B shown in FIG. 11A, and FIG. 11C shows a schematic sectional view cut along line 11C-11C shown in FIG. 11A. In FIG. 11A-FIG. 11C, similar elements to those in FIG. 10A-FIG. 10C have the same reference marks as those in FIG. 10A-FIG. 10C.

As shown in FIG. 11A-FIG. 11C, end faces of the wiring board and the antenna board are provided with a curved face for connecting both the boards together through the flexible wiring board. This is a different point from the structure shown in FIG. 10A-FIG. 10C, and the other structures remain unchanged from those shown in FIG. 10A-FIG. 10C.

To be more specific, as shown in FIG. 11C, SD memory card 5 includes solid circuit module 500 which is formed of wiring board 50 and antenna board 55, and wiring board 50 is coupled to antenna board 55 at end face 50C and end face 55C through flexible wiring board 17. At least end faces 50C and 55C are rounded to be curved face. On top of that, flexible wiring board 17 can be fixed to end face 50C of wiring board 50 and end face 55C of antenna board 55 with, e.g. rubber-based or epoxy-based adhesive 16B when necessary.

The foregoing structure allows end face 50C of wiring board 50 and end face 55C of antenna board 55 to have a curved face free from sharp-edged sections at least at the parts where flexible wiring board 17 is bent, so that flexible wiring board 17 can avoid being damaged during the manufacture or the operation of SD memory card 5. As a result, highly reliable SD memory card 5 is obtainable.

In this exemplary embodiment, flexible wiring board 17 is fixed to the end faces with adhesive 16B; however, the present invention is not limited to this example. For instance, when magnetic material 16 is bonded with adhesive put between wiring board 50 and antenna board 55, the adhesive sticking out from end face 50C of wiring board 50 and end face 55C of antenna board 55 can be used for fixing flexible wiring board 17 to the end faces. Fixation of flexible wiring board 17 to the end faces improves the mechanical strength and the connection reliability.

Fourth Exemplary Embodiment

Figure 12A:
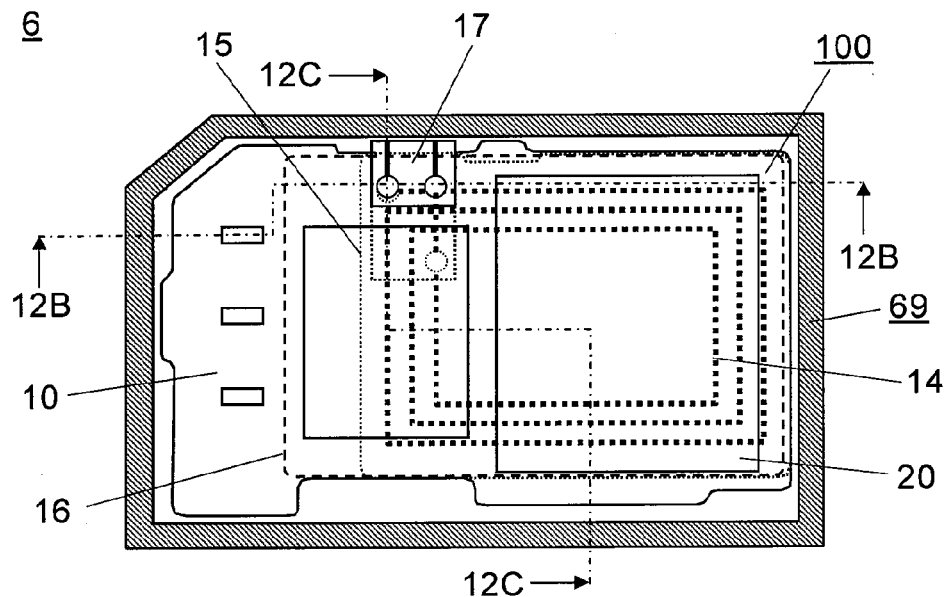
FIG. 12A shows a plan view schematically illustrates a structure of a card type information device in accordance with a fourth exemplary embodiment of the present invention.
Figure 12B:
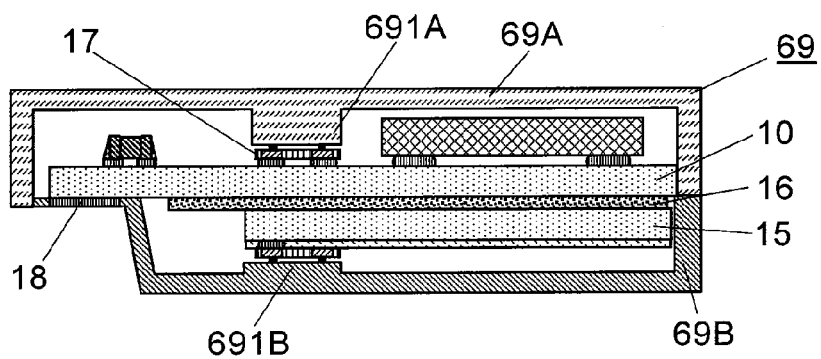
FIG. 12B shows a sectional view schematically illustrates a structure of the card type information device cut along line 12B-12B shown in FIG. 12A in accordance with the fourth exemplary embodiment of the present invention.
Figure 12C:
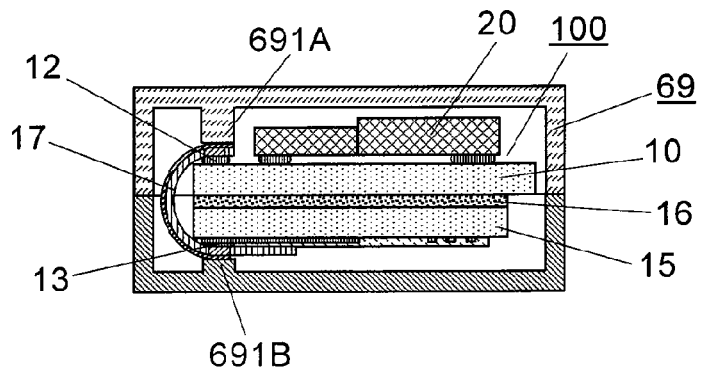
FIG. 12C shows a sectional view schematically illustrates a structure of the card type information device cut along line 12C-12C shown in FIG. 12A in accordance with the fourth exemplary embodiment of the present invention.

FIG. 12A shows a plan view schematically illustrates a structure of an SD memory card in accordance with the fourth exemplary embodiment of the present invention. FIG. 12B shows a schematic sectional view cut along line 12B-12B shown in FIG. 12A, and FIG. 12C shows a schematic sectional view cut along line 12C-12C shown in FIG. 12A. In FIG. 12A, an upper section of the housing is omitted in order to clearly show the interior structure. In FIG. 12A-FIG. 12C, similar elements to those in FIG. 1A-FIG. 1C have the same reference marks as those in FIG. 1A-FIG. 1C.

As shown in FIG. 12A-FIG. 12C, housing 69 has a protrusion at the places where antenna connecting electrode 12 and antenna terminal electrode 13, which are coupled together via flexible wiring board 17, are placed. This is the different point from the structure shown in FIG. 1A-FIG. 1C. The other points remain unchanged.

To be more specific, SD memory card 6 shown in FIG. 12A-FIG. 12C has protrusions 691A and 691B at the place inside housing 69, in which place antenna connecting electrode 12 and antenna terminal electrode 13 are coupled together via flexible wiring board 17. Housing 69 is made of, e.g. a polymer alloy of polycarbonate and ABS resin, and formed of upper housing 69A and lower housing 69B. Protrusions 691A and 691B can be unitarily molded with housing 69 made of, e.g. insulating material, or protrusions made of another insulating material can be rigidly mounted to the inside of housing 69.

Upper housing 69A and lower housing 69B are provided with protrusions 691A and 691B respectively in the foregoing structure; however, the present invention is not limited to this example. For instance, a protrusion may be fixed to either one of upper housing 69A or lower housing 69B, and then the protrusion urges the solid circuit module against the upper housing 69A or lower housing 69B whichever they do not have the protrusion. As a result, the construction can be simplified.

According to this fourth exemplary embodiment, solid circuit module 100 built in housing 69 is supported by protrusions 691A and 691B at the connecting section between antenna connecting electrode 12 of wiring board 10 and flexible wiring board 17 as well as the connecting section between antenna terminal electrode 13 of antenna board 15 and flexible wiring board 17. This structure allows preventing flexible wiring board 17 from peeling off from the connecting sections due to the restoring force of flexible wiring board 17 which is bent roundly. As a result, SD memory card 6, of which reliability about the connection is improved, is obtainable.

Figure 13A:
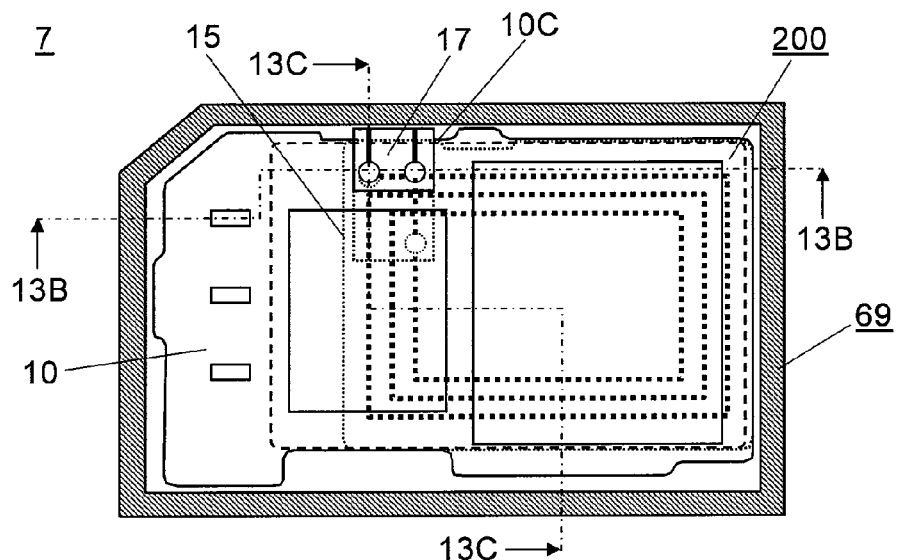
FIG. 13A shows a plan view schematically illustrates a structure of another card type information device in accordance with the fourth exemplary embodiment of the present invention.
Figure 13B:
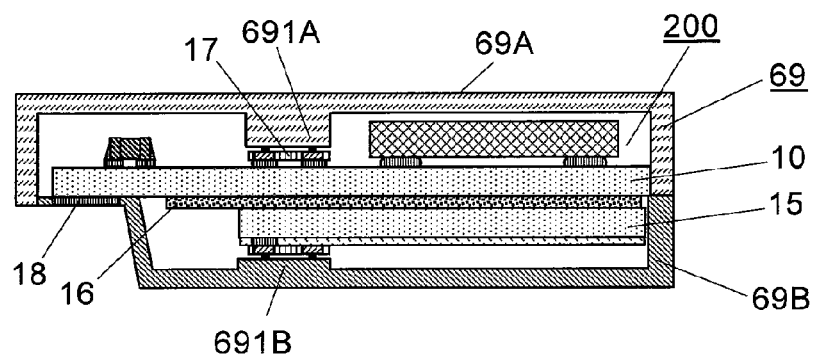
FIG. 13B shows a sectional view schematically illustrates a structure of the another card type information device cut along line 13B-13B shown in FIG. 13A in accordance with the fourth exemplary embodiment of the present invention.
Figure 13C:
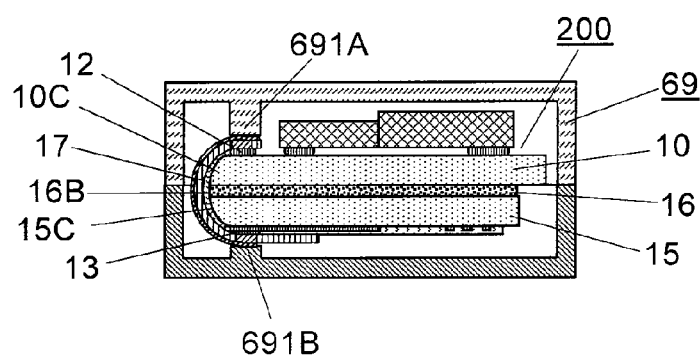
FIG. 13C shows a sectional view schematically illustrates a structure of the another card type information device cut along line 13C-13C shown in FIG. 13A in accordance with the fourth exemplary embodiment of the present invention.

Another example of the SD memory card in accordance with the fourth exemplary embodiment is demonstrated hereinafter with reference to FIG. 13A-FIG. 13C. FIG. 13A shows a plan view schematically illustrates a structure of another SD memory card in accordance with the fourth exemplary embodiment of the present invention. FIG. 13B shows a schematic sectional view cut along line 13B-13B shown in FIG. 13A, and FIG. 13C shows a schematic sectional view cut along line 13C-13C shown in FIG. 13A. In FIG. 13A, an upper section of the housing is omitted in order to clearly show the interior structure. In FIG. 13A-FIG. 13C, similar elements to those in FIG. 1A-FIG. 1C have the same reference marks as those in FIG. 1A-FIG. 1C.

To be more specific, SD memory card 7 shown in FIG. 13C includes solid circuit module 200 formed of wiring board 10 and antenna board 15, and at least a part, which is coupled via flexible wiring board 17, of end face 10C of wiring board 10 and end face 15C of antenna board 15 is curved. On top of that, if it is needed, flexible wiring board 17 can be bonded to end face 10C of wiring board 10 and end face 15C of antenna board 15 with e.g. rubber-based or epoxy-based adhesive 16B.

According to the foregoing structure, a similar advantage to what is discussed previously in this exemplary embodiment is obtainable, and on top of that, end face 10C of wiring board 10 and end face 15C of antenna board 15 are curved so that they can be free from sharpened sections where flexible wiring board is bent. As a result, flexible wiring board 17 can avoid being damaged during the manufacture or operation of SD memory card 7, so that highly reliable SD memory card 7 is obtainable.

In this example, flexible wiring board 17 is bonded with adhesive 16B; however, the present invention is not limited to this example. For instance, when magnetic material 16 is bonded with adhesive put between wiring board 10 and antenna board 15, the adhesive sticking out from end face 10C of wiring board 10 and end face 15C of antenna board 15 can be used for fixing flexible wiring board 17 to the end faces. Fixation of flexible wiring board 17 to the end faces improves the mechanical strength and the connection reliability.

In this exemplary embodiment, external connecting terminal 18 is included; however, the present invention is not limited to this example. For instance, wiring board 10 is not equipped with the external connecting terminal, but can be equipped only with a wireless function using the antenna pattern. This structure allows housing 69 to prevent dust or liquid from entering therein from the external environment. As a result, the reliability about the environment and durability can be greatly improved. Since SD memory card 7 has no external connecting terminal, it can be strong against static electricity and EMI (electromagnetic interference).

Figure 14A:
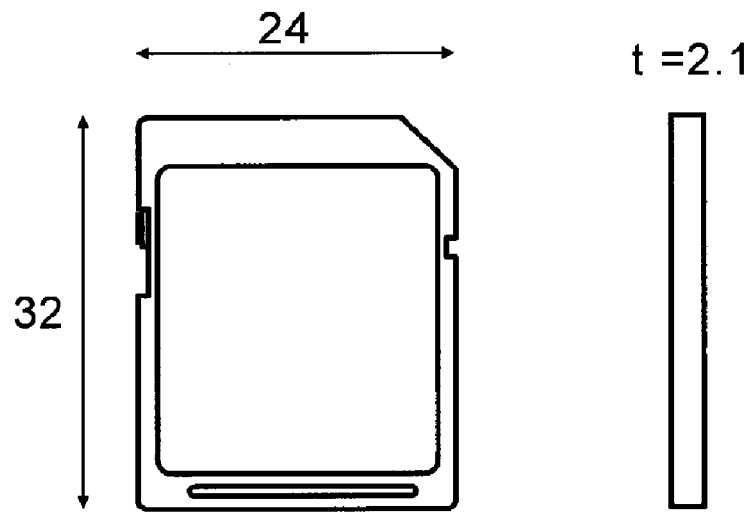
FIG. 14A schematically shows an appearance of an SD memory card.
Figure 14B:
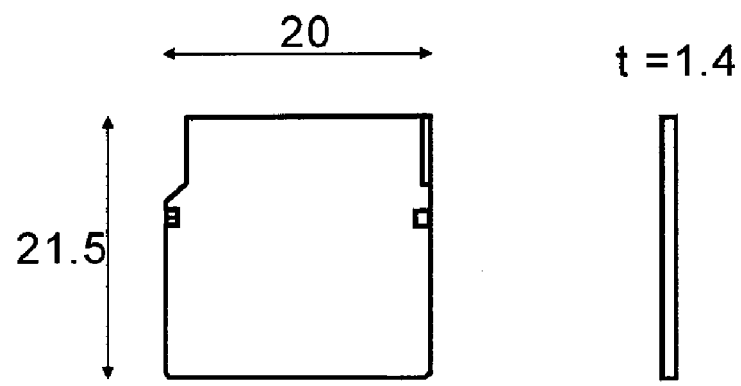
FIG. 14B schematically shows an appearance of a mini SD memory card.
Figure 14C:
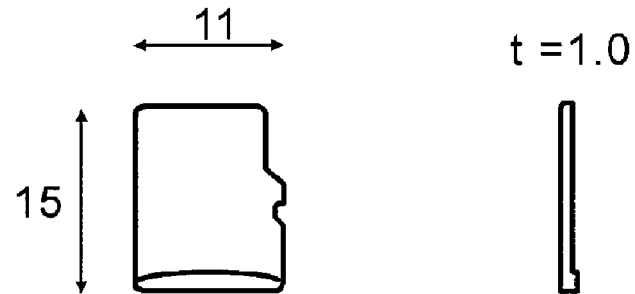
FIG. 14C schematically shows an appearance of a micro SD memory card.
Figure 15:
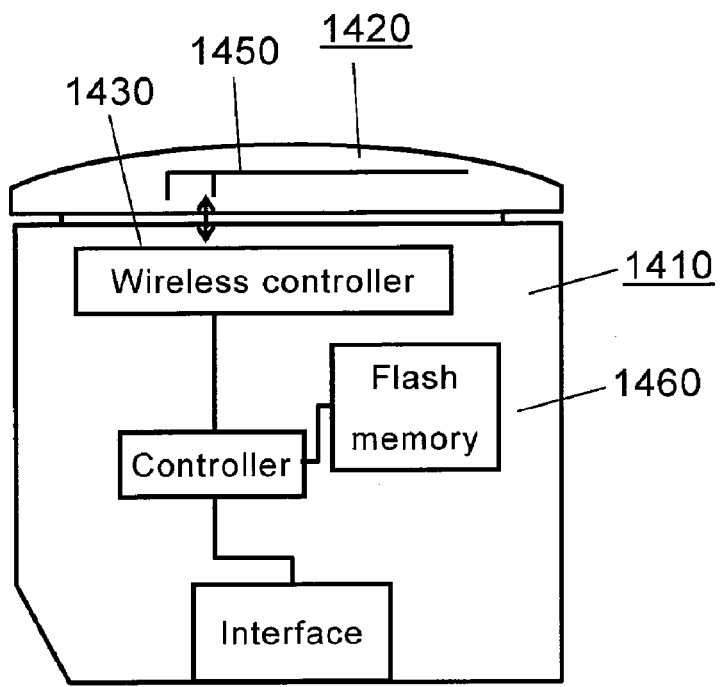
FIG. 15 illustrates a structure of a conventional SD memory card.
Figure 16:
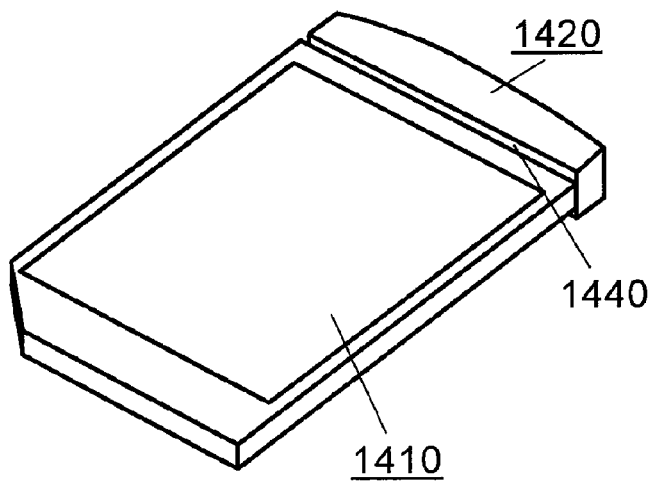
FIG. 16 shows a perspective view illustrating an appearance of the conventional SD memory card.

The external appearance and thickness of various SD memory cards in accordance with the exemplary embodiments discussed previously are specifically described with reference to FIG. 14A-FIG. 14C. FIG. 14A shows the SD memory card used in the exemplary embodiments previously discussed, and has the external dimensions of 24 mm×32 mm×2.1 mm complying with the standardized specification. FIG. 14B shows a mini SD card (registered trade mark) having smaller external dimensions of 20 mm×21.5 mm×1.4 mm complying with another standard. FIG. 14C shows a micro SD card (registered trade mark) having further smaller external dimensions of 11 mm×15 mm×1.0 mm complying with still another standard.

Various trade marks registered from makers are available, such as SD memory card, compact flash, smart media, xD picture card, memory stick, multi-media card, and the exemplary embodiments discussed previously are applicable to those products.

In the previous exemplary embodiments, the antenna pattern has an antenna length corresponding to 13.56 MHz bandwidth; however, the present invention is not limited to this example. For example, an antenna pattern having an antenna length corresponding to 2.4 GHz bandwidth complying with another standard can be used. Antenna patterns having different antenna lengths can be also used, thereby obtaining an SD memory card which performs multiple functions and works at multiple frequencies for various applications.

The manufacturing methods discussed previously use the slit parts provided to the motherboard in parts; however, the present invention is not limited to this example. For instance, a slit part of a motherboard can be curved in advance at its end face or a part of the end face. This motherboard can be manufactured through the following steps: a metal mold having a protrusion corresponding to the slit part is prepared, and solvent such as glass epoxy resin is poured into the metal mold and hardened there, then the glass epoxy resin is released from the metal mold.

This method allows the motherboard to have slit parts in advance, so that the number of steps in the manufacturing method can be reduced, thereby lowering the cost. On top of that, the method prevents the wiring patterns from being damaged in the processing steps. As a result, a highly reliable SD memory card is obtainable.

INDUSTRIAL APPLICABILITY

An SD memory card of the present invention has external dimensions complying with the standard ones and is equipped with an information transmission function in a non-contact manner besides a contact-connection function. This structure allows the SD memory card to be useful as an information transmission medium to be used in portable digital devices such as digital cameras, portable music players or portable information terminals.

The invention claimed is:

1. A card information device comprising:
a wiring board including a wiring pattern having at least one electronic component mounted to at least a first face of the wiring board, and an antenna connecting electrode;
an antenna board including an antenna pattern formed on a first face of the antenna board and having an antenna terminal electrode;
a magnetic material disposed between a second face of the wiring board and a second face of the antenna board, both of the second faces confronting each other;
a flexible wiring board for coupling the antenna connecting electrode to the antenna terminal electrode; and
a housing for accommodating at least the wiring board, the antenna board, the magnetic material, and the flexible wiring board,
wherein the wiring board is formed of an identical insulating motherboard to that of the antenna board.

2. The card information device of claim 1, wherein at least respective end faces of the wiring board and the antenna board, at which end faces the flexible wiring board couples the wiring board to the antenna board, are provided with a curved face.

3. The card information device of claim 1, wherein the magnetic material is at least large enough to cover the entire antenna board, and is disposed on the second face of one of the antenna board and the wiring board.

4. The card information device of claim 1, wherein the magnetic material is disposed at a region where the at least one electronic component exists.

5. The card information device of claim 1, wherein the electronic component includes at least a semiconductor memory element and a control circuit element.

6. The card information device of claim 1, wherein the wiring board is provided with an external connecting terminal.

7. The card information device of claim 1, wherein the housing includes a protrusion inside the housing and at least at a place where the flexible wiring board couples the antenna terminal electrode to the antenna connecting electrode.

8. A method of manufacturing a card information device comprising:

- forming an antenna connecting electrode, a wiring pattern, and an antenna pattern including an antenna terminal electrode, in a predetermined region on an insulating motherboard;
- forming a slit part on the insulating motherboard in parts for forming an antenna board including the antenna pattern having the antenna terminal electrode on a first face of the antenna board, and a wiring board having the wiring pattern and the antenna connecting electrode on a first face of the wiring board;
- mounting at least one electronic component to the wiring pattern formed on the wiring board, and coupling the antenna connecting electrode of the wiring board to the antenna terminal electrode of the antenna board with a flexible wiring board;
- providing a second face of one of the antenna board and the wiring board with magnetic material;
- separating the antenna board and the wiring board from the insulating motherboard;
- folding the wiring board over the antenna board in such a manner that a second face of the wiring board confronts the antenna board with the magnetic material existing therebetween; and
- accommodating at least the wiring board, the antenna board, the magnetic material, and the flexible wiring board, in a housing.

9. The method of manufacturing the card information device of claim 8, wherein the slit part has a width not smaller than a thickness of the magnetic material.

10. The method of manufacturing the card information device of claim 8, wherein the step of forming a slit part includes a step of curving at least respective end faces of the wiring board and the antenna board, at which end faces the wiring board and the antenna board are coupled together via the flexible wiring board.

11. The method of manufacturing the card information device of claim 8 further comprising:

- forming an external connecting terminal on the wiring board.

* * * * *